United States Patent
Ikushima

(10) Patent No.: US 8,770,439 B2
(45) Date of Patent: Jul. 8, 2014

(54) METHOD AND DEVICE FOR DISCHARGING A FIXED AMOUNT OF LIQUID

(75) Inventor: Kazumasa Ikushima, Mitaka (JP)

(73) Assignee: Musashi Engineering, Inc., Tokyo (JP)

( * ) Notice: Subject to any disclaimer, the term of this patent is extended or adjusted under 35 U.S.C. 154(b) by 289 days.

(21) Appl. No.: 13/375,814

(22) PCT Filed: Jun. 2, 2010

(86) PCT No.: PCT/JP2010/059315
§ 371 (c)(1),
(2), (4) Date: Feb. 13, 2012

(87) PCT Pub. No.: WO2010/140607
PCT Pub. Date: Dec. 9, 2010

(65) Prior Publication Data
US 2012/0132671 A1    May 31, 2012

(30) Foreign Application Priority Data

Jun. 3, 2009 (JP) .................................. 2009-133587

(51) Int. Cl.
*B65D 83/00* (2006.01)
(52) U.S. Cl.
USPC ............... 222/1; 222/263; 222/396; 222/399; 137/207; 137/209
(58) Field of Classification Search
USPC ......... 137/206, 207, 209; 184/57; 222/1, 263, 222/389, 394, 396, 399
See application file for complete search history.

(56) References Cited

U.S. PATENT DOCUMENTS

| | | | | |
|---|---|---|---|---|
| 3,504,825 A | * | 4/1970 | Kinsey et al. | 222/595 |
| 3,736,291 A | * | 5/1973 | Vogel | 528/212 |
| 7,464,838 B2 | * | 12/2008 | Mimura et al. | 222/389 |
| 8,464,902 B2 | * | 6/2013 | Conner et al. | 222/1 |
| 2010/0062296 A1 | * | 3/2010 | Johannessen | 429/19 |

(Continued)

FOREIGN PATENT DOCUMENTS

| JP | 2-017264 U | 2/1990 |
|---|---|---|
| JP | 2-015588 Y2 | 4/1990 |

(Continued)

OTHER PUBLICATIONS

International Search Report of PCT/JP2010/059315, mailing date Sep. 14, 2010.

*Primary Examiner* — Kevin P Shaver
*Assistant Examiner* — Patrick M Buechner
(74) *Attorney, Agent, or Firm* — Westerman, Hattori, Daniels & Adrian, LLP

(57) ABSTRACT

Method and device for discharging a fixed amount of liquid which enables to dispense a liquid material with a higher accuracy. The device includes: a decompression valve for reducing the pressure of a compressed gas supplied; a discharging valve for controlling the flow rate of the gas decompressed at the decompression valve; a liquid storing container for discharging liquid from a nozzle by the gas supplied via the discharging valve; and a buffer tank between the decompression valve and the discharging valve that has a volume greater than the volume of the liquid storage container. The invention suppresses the pressure reduction that occurs in the flow path for supplying the compressed gas to the liquid storage container during the operation of the decompression valve by making the flow resistance between the buffer tank and the storage container greater than that between the buffer tank and the decompression valve.

13 Claims, 4 Drawing Sheets

(56) References Cited

U.S. PATENT DOCUMENTS

| | | | |
|---|---|---|---|
| 2010/0170916 A1* | 7/2010 | Segers | 222/1 |
| 2010/0176147 A1* | 7/2010 | Segers | 222/1 |
| 2010/0176161 A1* | 7/2010 | Conner et al. | 222/389 |

FOREIGN PATENT DOCUMENTS

| | | | | |
|---|---|---|---|---|
| JP | 06003176 A | * | 1/1994 | G01F 11/00 |
| JP | 9-66251 A | | 3/1997 | |
| JP | 2002-361146 A | | 12/2002 | |
| JP | 2006-308105 A | | 11/2006 | |

* cited by examiner

METHOD AND DEVICE FOR DISCHARGING A FIXED AMOUNT OF LIQUID

TECHNICAL FIELD

The present invention relates to a method and an apparatus for discharging a fixed amount of liquid, in which a compressed gas supplied from a compressed gas source is decompressed to a certain pressure and a liquid material is quantitatively distributed or dispensed. For example, the present invention relates to a method and an apparatus (precision dispenser) for discharging a fixed amount of liquid, which can distribute or dispense a liquid material with high accuracy by minimizing a pressure reduction in a buffer tank.

BACKGROUND ART

A known apparatus for discharging a fixed amount of liquid operates to decompress a compressed gas supplied from a compressed gas source to a certain pressure and to distribute or dispense a liquid material. In that type of known apparatus, however, accuracy in an amount of the liquid material distributed or dispensed is insufficient. This may cause, for example, problems that, when a semiconductor chip is bonded to, e.g., a lead frame or a printed board, the chip is peeled off due to an insufficient amount of adhesive discharged, or short-circuiting is generated due to an electroconductive adhesive discharged in an excessive amount.

In view of the above-mentioned problems, the applicant has proposed a dispenser comprising a pressure reducing valve for decompressing a compressed gas supplied from a compressed gas source, a solenoid valve equipped with a timer for controlling an amount of the decompressed gas passing therethrough, and a dispensing nozzle for quantitatively distributing or dispensing a liquid material, which is stored in the dispensing nozzle, with the gas supplied through the solenoid valve, the dispenser discharging the fixed amount of the liquid material by directly pressing the surface of the liquid material, which is stored in the dispensing nozzle, with the compressed gas, wherein a buffer tank storing the compressed air and having a larger inner volume than the dispensing nozzle is disposed midway a line extending from the pressure reducing valve to the solenoid valve (Patent Document 1).

Also, there is proposed an applicator for applying an application material in a syringe to a printed board through a discharge nozzle by supplying compressed air under a predetermined pressure from a regulator, which is communicated with a compressed air source, to the syringe for a predetermined time with switching of a discharge valve, wherein the apparatus includes a pressure tank communicating with the regulator, storing the delivered compressed air, and supplying the compressed air to the discharge valve side (Patent Document 2).

In any of the above-described apparatuses, the buffer tank (pressure tank) is disposed to abruptly raise the pressure inside the syringe immediately after the valve opening for the discharge. With the action of the buffer tank, a high pressure can be obtained in a shorter discharge time than that in an apparatus not including the buffer tank. Accordingly, the pressure required to provide the desired discharge amount can be obtained in a shorter time and the discharge operation can be performed at a higher tact.

PRIOR ART LIST

Patent Documents

Patent Document 1: Japanese Utility Model Registration Publication No. H02-15588
Patent Document 2: Japanese Patent Laid-Open Publication No. H09-66251

SUMMARY OF THE INVENTION

Problems to be Solved by the Invention

With the provision of the buffer tank as in the above-described apparatus, it is possible to prevent an abrupt pressure reduction to some extent, which is caused in the line when the solenoid valve is operated. However, the above-described apparatus accompanies with a problem that a pressure reduction is caused inside the buffer tank. In other words, the problem of degradation in accuracy of the distribution or dispensing is not yet completely overcome because pressure temporarily reduces in a flow path through which the compressed gas is supplied to a liquid reservoir.

Further, the volume of the buffer tank is required to be, for example, 10 or more times the volume of the liquid reservoir, and such necessity has inhibited a size reduction of the apparatus.

In view of the above-described problems, an object of the present invention is to provide a method and an apparatus for discharging a fixed amount of liquid, which can distribute or dispense a liquid material with higher accuracy than the known apparatuses by minimizing a pressure reduction in a flow path through which a compressed gas is supplied to a liquid reservoir.

Means for Solving the Problems

The inventor has conducted intensive studies and has accomplished the present invention on the basis of the finding that the pressure reduction caused in the flow path, through which the compressed gas is supplied to the liquid reservoir, upon operation of the pressure reducing valve can be reduced by setting flow resistance of a flow path communicating the buffer tank and the liquid reservoir to be larger than flow resistance of a flow path communicating the buffer tank and the pressure reducing valve. In more detail, the method for discharging a fixed amount of liquid, according to the present invention, is constituted by the following technical means.

According to a first aspect of the present invention, there is provided a method for discharging a fixed amount of liquid by using an apparatus that comprises a pressure reducing valve for decompressing a compressed gas supplied from a pressure gas source, a discharge valve for controlling a passage amount of the gas decompressed by the pressure reducing valve, a liquid reservoir for discharging the liquid through a nozzle by pressing the liquid with the gas supplied through the discharge valve, and a buffer tank disposed between the pressure reducing valve and the discharge valve and having a larger volume than the liquid reservoir, wherein flow resistance of a flow path communicating the buffer tank and the liquid reservoir is set larger than flow resistance of a flow path communicating the buffer tank and the pressure reducing valve, thereby suppressing a pressure reduction that is generated in a flow path, through which the compressed gas is supplied to the liquid reservoir, when the pressure reducing valve is operated.

According to a second aspect of the present invention, in the method according to the first aspect, a part or the whole of the flow path communicating the buffer tank and the liquid reservoir is set to have a smaller diameter than a minimum inner diameter of the flow path communicating the buffer tank and the pressure reducing valve, thereby suppressing the pressure reduction that is generated in the flow path, through which the compressed gas is supplied to the liquid reservoir, when the pressure reducing valve is operated.

According to a third aspect of the present invention, in the method according to the first or second aspect, a portion having a smaller diameter than a minimum inner diameter of the flow path communicating the buffer tank and the pressure reducing valve is provided in a flow path inside the discharge valve, thereby suppressing the pressure reduction that is generated in the flow path, through which the compressed gas is supplied to the liquid reservoir, when the pressure reducing valve is operated.

According to a fourth aspect of the present invention, in the method according to any one of the first to third aspects, a length of the flow path communicating the buffer tank and the pressure reducing valve is set shorter than a length of the flow path communicating the buffer tank and the liquid reservoir, thereby suppressing the pressure reduction that is generated in the flow path, through which the compressed gas is supplied to the liquid reservoir, when the pressure reducing valve is operated.

According to a fifth aspect of the present invention, in the method according to any one of the first to fourth aspects, a second pressure reducing valve is further disposed between the aforesaid pressure reducing valve and the compressed gas source, thereby suppressing the pressure reduction that is generated in the flow path, through which the compressed gas is supplied to the liquid reservoir, when the pressure reducing valve is operated.

According to a sixth aspect of the present invention, in the method according to the fifth aspect, a second buffer tank is further disposed between the aforesaid pressure reducing valve and the second pressure reducing valve, thereby suppressing the pressure reduction that is generated in the flow path, through which the compressed gas is supplied to the liquid reservoir, when the pressure reducing valve is operated.

Further, an apparatus for discharging a fixed amount of liquid according to the present invention is constituted by the following technical means.

According to a seventh aspect of the present invention, there is provided an apparatus for discharging a fixed amount of liquid, the apparatus comprising a pressure reducing valve for decompressing a compressed gas supplied from a pressure gas source, a discharge valve for controlling a passage amount of the gas decompressed by the pressure reducing valve, a liquid reservoir for discharging the liquid through a nozzle by pressing the liquid with the gas supplied through the discharge valve, and a buffer tank disposed between the pressure reducing valve and the discharge valve and having a larger volume than the liquid reservoir, wherein flow resistance of a flow path communicating the buffer tank and the liquid reservoir is set larger than flow resistance of a flow path communicating the buffer tank and the pressure reducing valve.

According to an eighth aspect of the present invention, in the apparatus according to the seventh aspect, a part or the whole of the flow path communicating the buffer tank and the liquid reservoir is set to have a smaller diameter than a minimum inner diameter of the flow path communicating the buffer tank and the pressure reducing valve.

According to a ninth aspect of the present invention, in the apparatus according to the seventh or eighth aspect, a portion having a smaller diameter than a minimum inner diameter of the flow path communicating the buffer tank and the pressure reducing valve is provided in a flow path inside the discharge valve.

According to a tenth aspect of the present invention, in the apparatus according to any one of the seventh to ninth aspects, a length of the flow path communicating the buffer tank and the pressure reducing valve is set shorter than a length of the flow path communicating the buffer tank and the liquid reservoir.

According to an eleventh aspect of the present invention, in the apparatus according to any one of the seventh to tenth aspects, a second pressure reducing valve is further disposed between the aforesaid pressure reducing valve and the compressed gas source.

According to a twelfth aspect of the present invention, in the apparatus according to the eleventh aspect, a second buffer tank is further disposed between the aforesaid pressure reducing valve and the second pressure reducing valve.

According to a thirteenth aspect of the present invention, in the apparatus according to any one of the seventh to twelfth aspects, an inner volume of the buffer tank is 1.5 times or more and less than 10 times an inner volume of the reservoir.

Effect of the Invention

With the present invention, since the pressure reduction in the flow path through which the compressed gas is supplied to the liquid reservoir can be minimized, the liquid can be distributed or dispensed with higher accuracy than in the known apparatuses.

Also, since the buffer tank is no longer required to have a so large volume, the size of the apparatus can be reduced.

Further, when the pressure reducing valve and/or the buffer tank is disposed in plural, pressure variations caused by mechanical pressure regulating operation of the pressure reducing valve can be avoided from being directly exerted on the liquid inside the liquid reservoir, and hence more stable pressure can be supplied.

MODE FOR CARRYING OUT THE INVENTION

Figure 1:
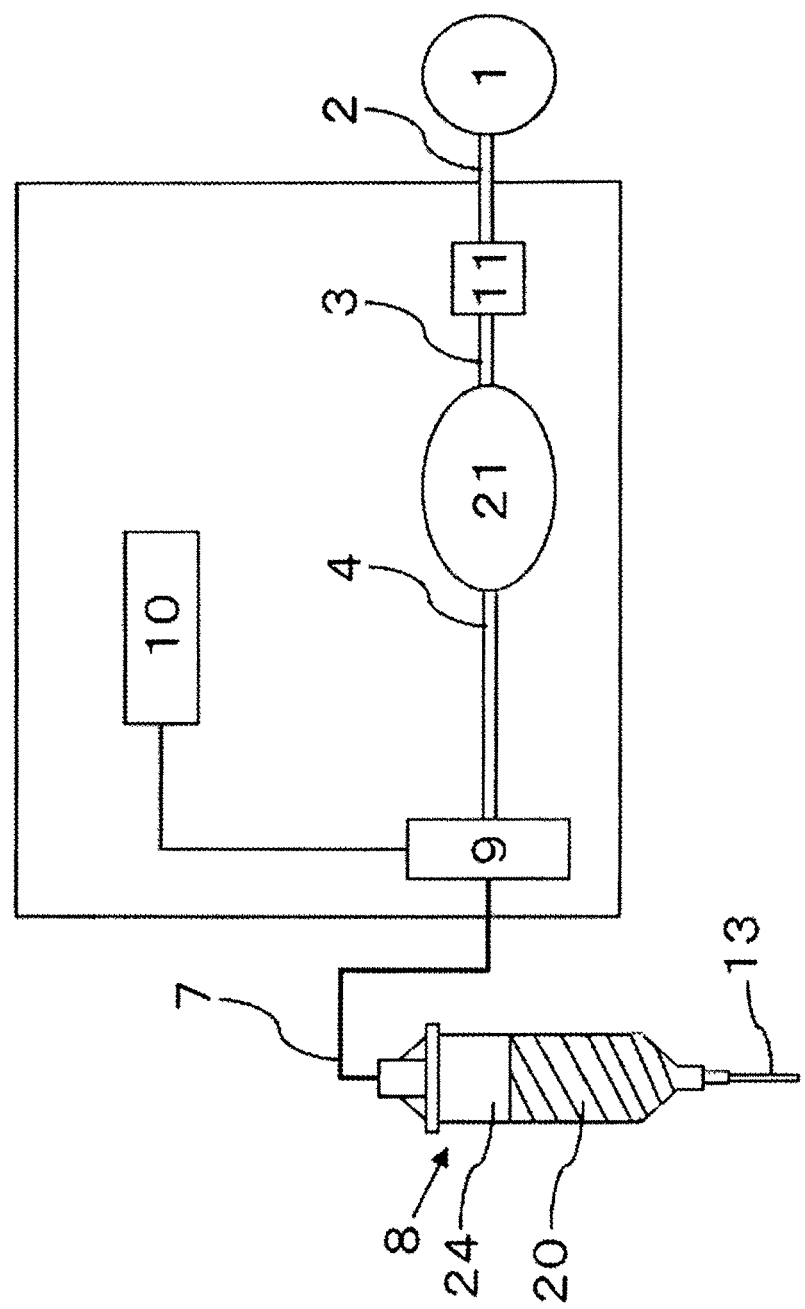
FIG. 1 is a block diagram illustrating schematic configuration of an apparatus for discharging a fixed amount of liquid according to Embodiment 1.

As illustrated in FIG. 1, by way of example, an apparatus of the present invention includes, as main components, a reservoir 8 storing a liquid and communicating with a discharge port through which the liquid is discharged, a pressure reducing valve 11 for decompressing a compressed gas supplied from a compressed gas source 1, a buffer tank 21 storing the compressed gas and having a larger inner volume than the reservoir 8, a discharge valve 9 for selectively establishing or cutting off communication between the pressure reducing valve 11 and the reservoir 8 through the buffer tank 21, and a timer 10 for opening or closing the discharge valve 9 and controlling a passage amount of the decompressed gas.

When the apparatus of the present invention is in an inoperative state, a space 24 through which a pressure is applied to a liquid 20 stored in the reservoir 8 is opened to the atmosphere, and hence the liquid is not discharged. On the other hand, when the apparatus is in an operative (discharge) state, the liquid 20 is discharged from the nozzle 13 by actuating the discharge valve 9 to communicate the buffer tank 21 with the reservoir 8, cutting off the space 24 from the atmosphere, and then supplying air to the reservoir 8 from the buffer tank 21 so as to raise the pressure in the space 24. On that occasion, when the air is supplied from the buffer tank 21 to the space 24, the pressure in a line 4 temporarily reduces, thus causing pulsations. Such a problem becomes more significant as the discharge of the liquid 20 is repeated and the volume of the space 24 is increased.

In the apparatus of the present invention, therefore, a pressure reduction in a flow path (downstream-side flow path) communicating the buffer tank 21 and the reservoir 8 is prevented by not only providing the buffer tank 21 having a relatively larger volume in comparison with the reservoir 8 as in the known apparatus, but also increasing flow resistance of the flow path communicating the buffer tank 21 and the reservoir 8. Specifically, in the apparatus of the present invention disclosed herein, the flow path downstream of the buffer tank 21 is formed, for example, such that its inner diameter is partly smaller than a minimum inner diameter of a flow path upstream of the buffer tank 21. In more detail, a restrictor (e.g., a narrower portion or an orifice) is disposed in the line 4, the discharge valve 9, and a line 7, which constitute the flow path between the buffer tank 21 and the reservoir 8, to thereby provide a portion having a smaller diameter than inner diameters of a line 3, the pressure reducing valve 11, and a line 2, which constitute a flow path between the buffer tank 21 and the compressed gas source 1. It is here important that the flow resistance of the flow path downstream of the buffer tank 21 is sufficiently larger than the flow resistance of the flow path upstream thereof. Such a feature can also be realized, for example, by setting the equivalent hydraulic diameter and/or the inner diameter of the downstream-side flow path to be entirely smaller than those (that) of the upstream-side flow path.

With the construction described above, during a period until the pressure reducing valve 11 is operated and the compressed gas is supplied, a pressure reduction inside the buffer tank 21 can be reduced and the desired pressure can be stably applied to the space 24. Stated another way, in the apparatus of the present invention, since the flow resistance on the delivery side of the buffer tank is sufficiently large, a speed of the air supplied to the buffer tank is relatively higher than that of the air delivered from the buffer tank. As a result, the pressure reduction in the flow path downstream of the buffer tank 21 can be minimized.

The flow resistance of the flow path downstream of the buffer tank 21 is adjusted to be optimum in consideration of the relationship between the speed at which the compressed gas can be supplied to the reservoir 8 and the pressure reduction in the flow path through which the compressed gas is supplied to the liquid reservoir.

Further, the length of the line 3 is preferably set shorter than the total length of the lines 4 and 7 (e.g., not larger than ⅔ or ½). With that setting, the gas under the regulated pressure can be more smoothly supplied when the discharge valve 9 is opened.

Figure 2:
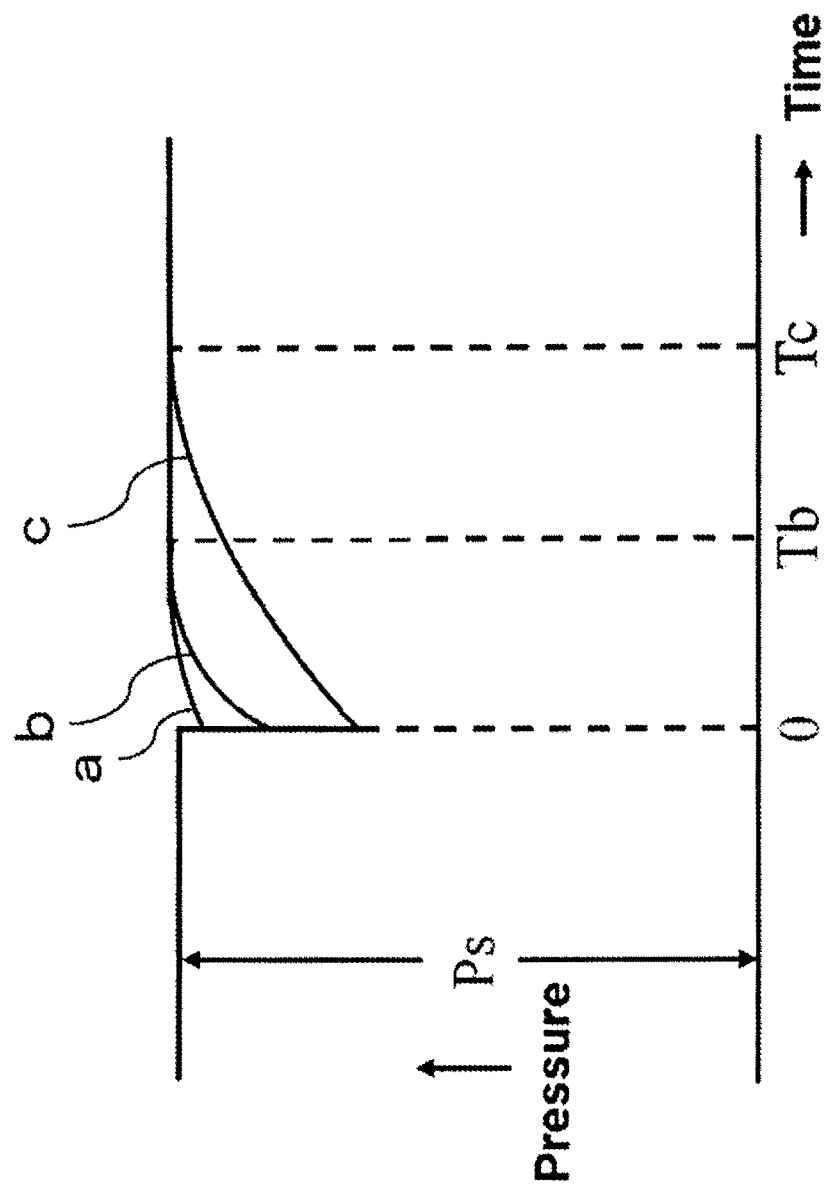
FIG. 2 is a graph depicting time-lapse changes of a gas pressure in a line connecting a discharge valve and a buffer tank.

FIG. 2 is a graph depicting time-lapse changes of the gas pressure in the line 4 connecting the discharge valve 9 and the buffer tank 21. A curve c represents change of the gas pressure in the known apparatus. As seen from the curve c, a time Tc takes until the gas pressure in the line 4 is returned to the initial state with the operation of the discharge valve 9. A curve b represents change of the gas pressure in the apparatus including the buffer tank. Although some improvement is obtained in that apparatus, the pressure change until the gas pressure in the line 4 returns to the initial state is depicted by a comparatively steep curve. A curve a represents change of the gas pressure in the line 4 of apparatus of the present invention. From the curve a, it is confirmed that the pressure reduction in the line 4 is minimum.

Figure 3:
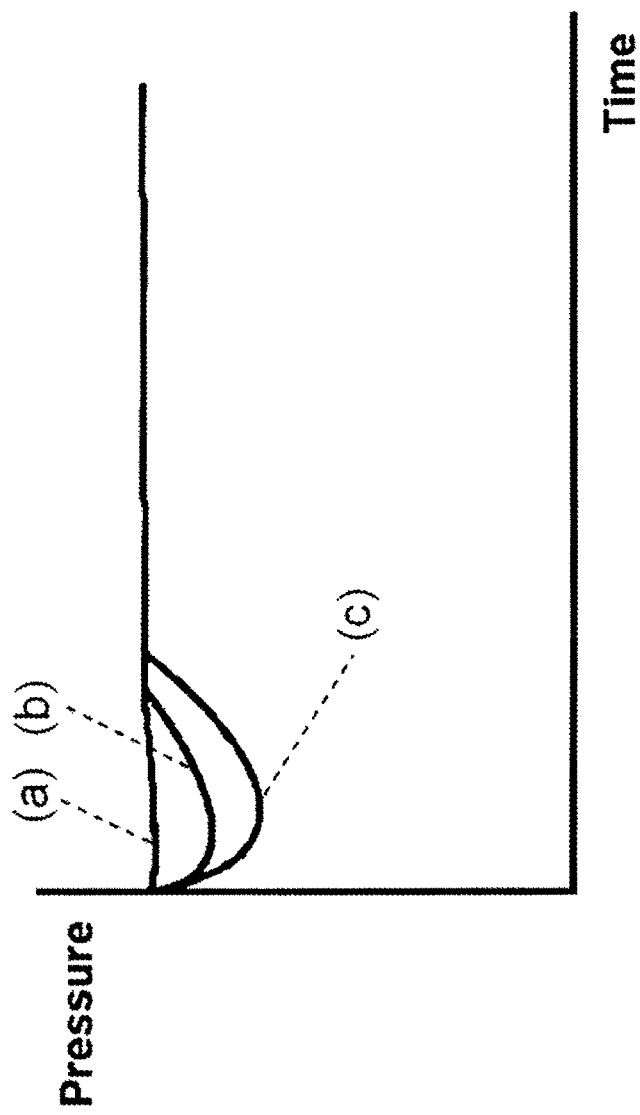
FIG. 3 is a graph depicting time-lapse changes of a gas pressure inside the buffer tank.

FIG. 3 is a graph depicting time-lapse changes of the gas pressure inside the buffer tank 21. In FIG. 3, a curve (c) represents change of the gas pressure in the known apparatus, a curve (b) represents change of the gas pressure in the apparatus including the buffer tank, and a curve (a) represents change of the gas pressure in the apparatus of the present invention. Thus, it is confirmed that there is a certain correlation between the change of the gas pressure in the buffer tank 21 and the change of the gas pressure in the line 4.

Since, as depicted in FIGS. 2 and 3, the pressure reduction in the flow path for supplying the compressed air to the reservoir 8 can be minimized in the apparatus of the present invention, distribution or dispensing of the liquid material can be controlled with higher accuracy than those in the known apparatuses.

According to the present invention having the above-described construction, the inner volume of the buffer tank can be set to the range of 1.5 times to less than 10 times that of the reservoir. It is to be noted that, when the apparatus size is out of the question, a volume ratio of the buffer tank to the reservoir may be set to the range of 10 to 100 times. Further, the buffer tank and/or the pressure reducing valve may be disposed in plural.

Details of the present invention will be described below in connection with embodiments, but the present invention is in no way restricted by the following embodiments.

Embodiment 1

A discharging apparatus of Embodiment 1 is constructed as illustrated in FIG. 1, and it includes, as main components, a reservoir (syringe) 8 storing a liquid and communicating with a discharge port through which the liquid is discharged, a pressure reducing valve (regulator) 11 for decompressing a compressed gas supplied from a compressed gas source 1, a buffer tank 21 storing the compressed gas and having a larger inner volume than the reservoir 8, a discharge valve 9 for selectively establishing or cutting off communication between the pressure reducing valve 11 and the reservoir 8 through the buffer tank 21, and a timer 10 for opening or closing the discharge valve 9 and controlling a passage amount of the decompressed gas. Lines 2 to 4 and 7 interconnecting those components have the same diameter selected to fall within the range of φ1 to φ10 mm. The length of the line 3 is set shorter than the total length of the lines 4 and 7. Practically, in an example disclosed here, the length of the line 3 is set to several tens centimeters and the total length of the lines 4 and 7 is set to 1 m or longer though depending on the layout of the lines routed, and so on.

The volume of the reservoir 8 in this embodiment is 1 to 500 cc, and the volume of the buffer tank 21 is in the range of 1.5 times to less than 10 times that of the reservoir 8. A dispensing nozzle including the reservoir 8 and a nozzle 13 is mounted on, e.g., an XYZ-robot.

In the apparatus of this embodiment, for example, a gas under a pressure of 3 kg/cm$^2$ is supplied from the compressed gas source 1, and the gas pressure is regulated by the pressure reducing valve 11 to be reduced to a certain pressure selected to fall within the range of 0.3 to 1.0 kg/cm$^2$.

The apparatus of this embodiment is designed such that the line diameter on the delivery side of the buffer tank 21 is smaller than the line diameter on the supply side thereof. More specifically, a narrowed portion having a line diameter of 1 μm to 5 mm is provided in the discharge valve 9 that is positioned on the delivery side of the buffer tank 21.

In the apparatus of this embodiment having the above-described construction, the liquid material is discharged by carrying out steps of operating the discharge valve 9 and the pressure reducing valve 11 in a coordinated manner. The liquid material is distributed or dispensed, for example, by carrying out the following steps;

i) step of opening the discharge valve 9, whereupon the air in the buffer tank 21 is delivered and the pressure in the buffer tank 21 reduces, ii) step of causing the pressure reducing valve 11 to detect the pressure reduction in the buffer tank 21, and starting pressure supply into the buffer tank 21, and iii) step of raising the reduced pressure in the buffer tank with the action of the pressure reducing valve.

In the above-described steps, there may occur a time difference until the pressure reducing valve 11 starts the operation, i.e., a time lag between the steps i) and ii). For minimizing such a time lag, it is effective to increase the flow resistance on the downstream side of the buffer tank 21. It is also preferable to set the length of the flow path communicating the buffer tank 21 and the pressure reducing valve 11 with each other as short as possible.

Embodiment 2

Figure 4:
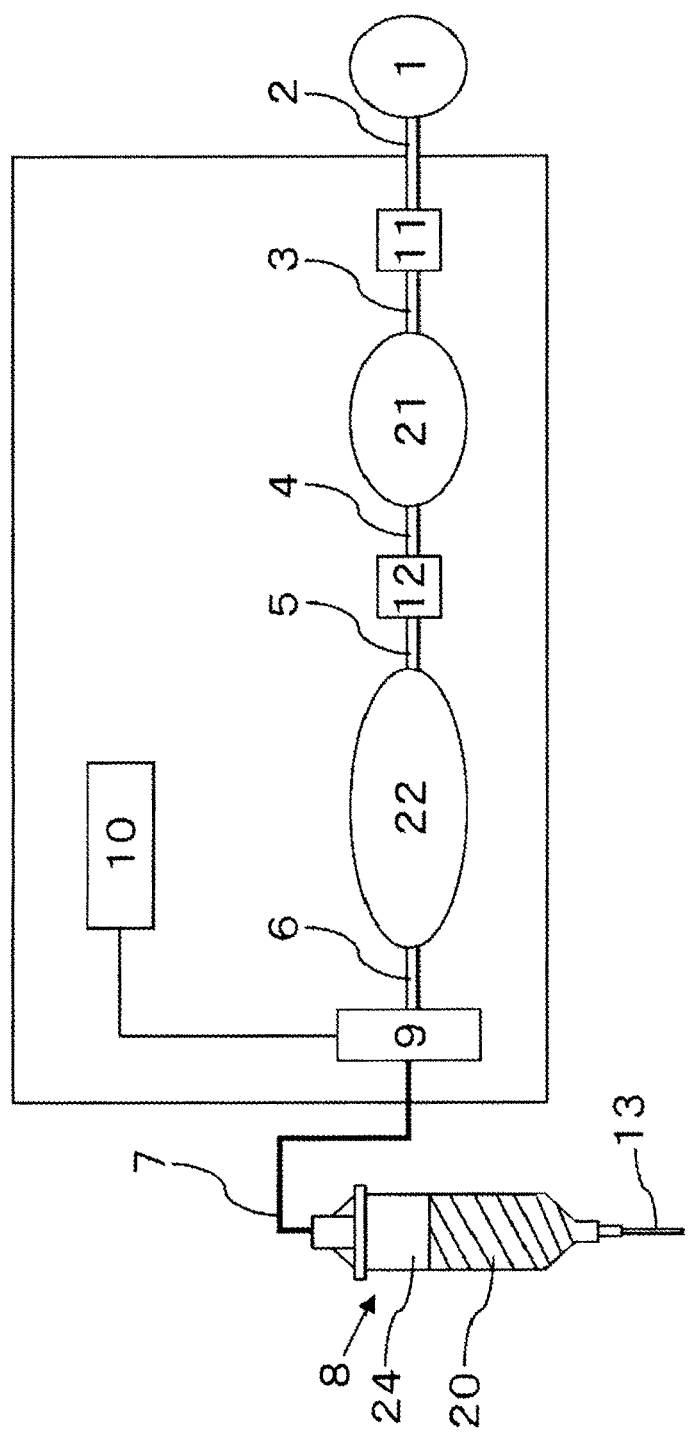
FIG. 4 is a block diagram illustrating schematic configuration of an apparatus for discharging a fixed amount of liquid according to Embodiment 2.

A discharging apparatus of Embodiment 2 is constructed as illustrated in FIG. 4, and it includes a second buffer tank 22, a second pressure reducing valve 12, and lines 5 and 6 in addition to the discharging apparatus of Embodiment 1.

With the construction of Embodiment 2 in which the buffer tank is provided in plural, pressure variations caused by mechanical pressure regulating operations of the pressure reducing valves 11 and 12 can be avoided from being directly exerted on the liquid material inside the reservoir 8, and hence more stable pressure can be supplied. That point will be described in detail below.

In general, a pressure reducing valve acts to regulate a primary pressure, which is introduced to the pressure reducing valve, inside the pressure reducing valve for conversion to a desired secondary pressure. In order to generate the stable secondary pressure with high accuracy, however, the stable primary pressure is preferably introduced to the pressure reducing valve. The reason resides in that, if the primary pressure introduced to the pressure reducing valve changes, the secondary pressure also varies, thereby causing variations in the pressure applied to the liquid in the reservoir. Thus, stabilizing the primary pressure is an important factor from the viewpoint of stabilizing the pressure that acts on the liquid in the reservoir. In other words, the primary pressure can be stabilized by providing the pressure reducing valves in series.

In the case including the pressure reducing valve in series, when a varying pressure is supplied from the upstream side, a gas (air) is first supplied to the primary side of the pressure reducing valve on the upstream side, and a reduced pressure is then output from the secondary side of the pressure reducing valve on the upstream side. At that time, the pressure output from the secondary side of the pressure reducing valve on the upstream side is regulated so as to vary within the range smaller than that of variations of the pressure supplied to the primary thereof. The pressure thus reduced and regulated is supplied to the primary side of the pressure reducing valve on the downstream side. The air supplied to the primary side of the pressure reducing valve on the downstream side is further reduced by the pressure reducing valve on the downstream side and then output from the secondary side thereof. At that time, the pressure output from the secondary side of the pressure reducing valve on the downstream side is regulated so as to vary within the range smaller than that of variations of the pressure output from the pressure reducing valve on the upstream side. In such a way, the construction including the pressure reducing valve in series enables the more stable pressure to be supplied in comparison with the case using a single pressure reducing valve.

For the same reason, a certain pressure stabilizing effect can be obtained by adding only the pressure reducing valve without providing the second buffer tank. However, by supplying, to the second buffer tank 22, the air having been subjected to the pressure stabilization through the second pressure reducing valve, the pressure in the flow path downstream of the buffer tank 22 can be further stabilized.

With the apparatus of Embodiment 2 having the above-described construction, the size of the apparatus is increased in comparison with that of the apparatus of Embodiment 1, but the liquid material can be distributed or dispensed with higher accuracy.

Industrial Applicability

The present invention can be applied to a wide variety of applications, aiming to feed liquids, without being limited to the cases discharging or applying the liquid material.

EXPLANATION OF REFERENCE NUMERALS

1 compressed gas source
2 to 7 line
8 reservoir
9 discharge valve (solenoid valve)
10 timer
11 pressure reducing valve (first pressure reducing valve)
12 second pressure reducing valve
13 nozzle
20 liquid
21 buffer tank (first buffer tank)
22 second buffer tank
24 space

The invention claimed is:

1. A method for discharging a fixed amount of liquid, comprising:
   providing an apparatus that comprises a first pressure reducing valve for decompressing a compressed gas supplied from a pressure gas source, a discharge valve for controlling a passage amount of the gas decompressed by the first pressure reducing valve, a liquid reservoir for discharging the liquid through a nozzle by pressing the liquid with the gas supplied through the discharge valve, and a buffer tank disposed between the first pressure reducing valve and the discharge valve and having a larger volume than the liquid reservoir,
   setting flow resistance of a flow path communicating the buffer tank and the liquid reservoir larger than flow resistance of a flow path communicating the buffer tank and the first pressure reducing valve, thereby suppressing a pressure reduction that is generated in a flow path, through which the compressed gas is supplied to the liquid reservoir, when the first pressure reducing valve is operated.

2. The method for discharging a fixed amount of liquid according to claim 1, wherein a part or the whole of the flow path communicating the buffer tank and the liquid reservoir is set to have a smaller diameter than a minimum inner diameter of the flow path communicating the buffer tank and the first pressure reducing valve, thereby suppressing the pressure reduction that is generated in the flow path, through which the compressed gas is supplied to the liquid reservoir, when the first pressure reducing valve is operated.

3. The method for discharging a fixed amount of liquid according to claim 2, wherein a portion having a smaller diameter than a minimum inner diameter of the flow path communicating the buffer tank and the first pressure reducing valve is provided in a flow path inside the discharge valve, thereby suppressing the pressure reduction that is generated in the flow path, through which the compressed gas is supplied to the liquid reservoir, when the first pressure reducing valve is operated.

4. The method for discharging a fixed amount of liquid according to claim 1 or 2, wherein a length of the flow path communicating the buffer tank and the first pressure reducing valve is set shorter than a length of the flow path communicating the buffer tank and the liquid reservoir, thereby suppressing the pressure reduction that is generated in the flow path, through which the compressed gas is supplied to the liquid reservoir, when the first pressure reducing valve is operated.

5. The method for discharging a fixed amount of liquid according to claim 1 or 2, wherein a second pressure reducing valve is further disposed between the first pressure reducing valve and the compressed gas source, thereby suppressing the pressure reduction that is generated in the flow path, through which the compressed gas is supplied to the liquid reservoir, when the first pressure reducing valve is operated.

6. The method for discharging a fixed amount of liquid according to claim 5, wherein a second buffer tank is further disposed between the first pressure reducing valve and the second pressure reducing valve, thereby suppressing the pressure reduction that is generated in the flow path, through which the compressed gas is supplied to the liquid reservoir, when the first pressure reducing valve is operated.

7. An apparatus for discharging a fixed amount of liquid, the apparatus comprising:
   a pressure reducing valve for decompressing a compressed gas supplied from a pressure gas source;
   a discharge valve for controlling a passage amount of the gas decompressed by the pressure reducing valve;
   a liquid reservoir for discharging the liquid through a nozzle by pressing the liquid with the gas supplied through the discharge valve; and
   a buffer tank disposed between the pressure reducing valve and the discharge valve and having a larger volume than the liquid reservoir,
   wherein flow resistance of a flow path communicating the buffer tank and the liquid reservoir is set larger than flow resistance of a flow path communicating the buffer tank and the pressure reducing valve.

8. The apparatus for discharging a fixed amount of liquid according to claim 7, wherein a part or the whole of the flow path communicating the buffer tank and the liquid reservoir is set to have a smaller diameter than a minimum inner diameter of the flow path communicating the buffer tank and the pressure reducing valve.

9. The apparatus for discharging a fixed amount of liquid according to claim 7 or 8, wherein a portion having a smaller diameter than a minimum inner diameter of the flow path communicating the buffer tank and the pressure reducing valve is provided in a flow path inside the discharge valve.

10. The apparatus for discharging a fixed amount of liquid according to claim 7 or 8, wherein a length of the flow path communicating the buffer tank and the pressure reducing valve is set shorter than a length of the flow path communicating the buffer tank and the liquid reservoir.

11. The apparatus for discharging a fixed amount of liquid according to claim 7 or 8, wherein a second pressure reducing valve is further disposed between the aforesaid pressure reducing valve and the compressed gas source.

12. The apparatus for discharging a fixed amount of liquid according to claim 11, wherein a second buffer tank is further disposed between the aforesaid pressure reducing valve and the second pressure reducing valve.

13. The apparatus for discharging a fixed amount of liquid according to claim 7 or 8, wherein an inner volume of the buffer tank is 1.5 times or more and less than 10 times an inner volume of the reservoir.

* * * * *